United States Patent
Kuwamura et al.

[11] Patent Number: 5,976,916
[45] Date of Patent: Nov. 2, 1999

[54] METHOD OF PRODUCING SEMICONDUCTOR DEVICE AND ENCAPSULATING PELLET EMPLOYED THEREIN

[75] Inventors: Makoto Kuwamura; Kazuhiro Ikemura; Shinya Akizuki; Takashi Fukushima; Shinichiro Sudo; Satoshi Ito, all of Ibaraki, Japan

[73] Assignee: Nitto Denko Corporation, Ibaraki, Japan

[21] Appl. No.: 08/737,137

[22] PCT Filed: Mar. 5, 1996

[86] PCT No.: PCT/JP96/00523

§ 371 Date: Nov. 7, 1996

§ 102(e) Date: Nov. 7, 1996

[87] PCT Pub. No.: WO96/27900

PCT Pub. Date: Sep. 12, 1996

[30] Foreign Application Priority Data

Mar. 7, 1995 [JP] Japan ................................. 7-047567

[51] Int. Cl.$^6$ ............................................. H01L 21/56
[52] U.S. Cl. .................... 438/126; 438/124; 438/126; 438/127
[58] Field of Search ................................. 438/124, 126, 438/127; 257/788, 789, 794, 795, 796

[56] References Cited

U.S. PATENT DOCUMENTS

| 4,572,853 | 2/1986 | Ikeya et al. ............................ 428/325 |
| 4,710,796 | 12/1987 | Ikeya et al. ............................ 428/325 |
| 5,041,396 | 8/1991 | Valero ................................... 438/126 |
| 5,243,756 | 9/1993 | Hamburgen et al. .................... 438/124 |
| 5,294,835 | 3/1994 | Igarashi et al. ........................ 257/793 |

FOREIGN PATENT DOCUMENTS

| 63-33852 | 2/1988 | Japan . |
| 63-110645 | 5/1988 | Japan . |
| 2-209949 | 8/1990 | Japan . |
| 2-224360 | 9/1990 | Japan . |
| 3-21628 | 1/1991 | Japan . |
| 5-67702 | 3/1993 | Japan . |
| 6-177275 | 6/1994 | Japan . |
| 6-188334 | 7/1994 | Japan . |
| 7-022755 | 1/1995 | Japan . |

Primary Examiner—Olik Chaudhuri
Assistant Examiner—Alonzo Chambliss
Attorney, Agent, or Firm—Armstrong, Westerman, Hattori, McLeland & Naughton

[57] ABSTRACT

A method of production of a semiconductor device such as a plastic pin grid array (PPGA) and a plastic ball grid array (PBGA) having a cavity-fill form. In this method, first, a semiconductor element (3) is placed in a cavity (6) formed in a multiple step-like substrate (2). Under this state, a pellet (7), which is in a solid state at a normal temperature, made of an encapsulating resin composition containing specific components, and has specific characteristics, is placed on the semiconductor element (3). Next, the semiconductor device is heated so that the pellet can melt to fill the cavity (6) with the composition, thereby encapsulating the semiconductor device (3). According to the present invention, a semiconductor device having low stress performance and excellent moisture-proof reliability can be efficiently produced.

10 Claims, 3 Drawing Sheets

METHOD OF PRODUCING SEMICONDUCTOR DEVICE AND ENCAPSULATING PELLET EMPLOYED THEREIN

FIELD OF THE INVENTION

The present invention relates to a method of producing semiconductor devices such as a plastic pin grid array (PPGA) and a plastic ball grid array (PBGA) having a high performance in cavity-fill form as a multi-in/out electrode (Multi I/O) and an encapsulating pellet employed therein.

BACKGROUND OF THE INVENTION

Figure 5:
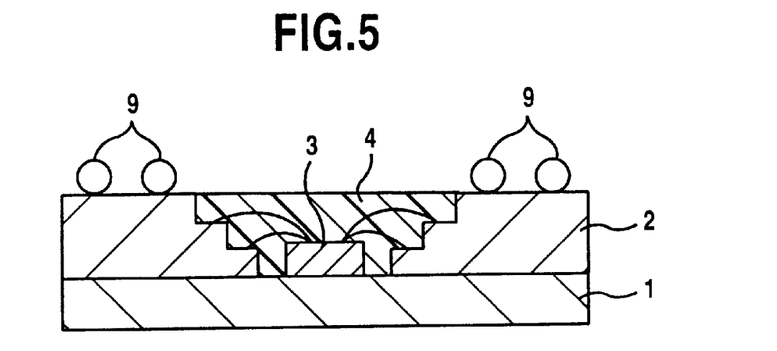
FIG. 5 is a sectional view illustrating the structure of PBGA.

As a challenge required in line with the recent improvement in performance of semiconductor devices, how to package a high wattage multi-in/out device and also how to shorten a wire length between the device and a mother board have come to a technical aim. Besides, it is another theme how to achieve the above aim at a low cost, including process cost, with high reliability. As countermeasures to these problems, a cavity-fill formed PPGA or PBGA having a structure shown in FIG. 5 is proposed. Namely, a substrate 2 comprising a multi-layer circuit with a center hole is put on a metallic heat sink 1. Then, a semiconductor element 3 is incorporated within a cavity formed with the metallic heat sink 1 and the substrate 2, which is encapsulated with a resin layer 4. In FIG. 5, 9 are conductive globular bumps. As a method of encapsulating a semiconductor element, a method of encapsulating by covering a cavity with a ceramic board may be listed in addition to the above encapsulating method using the resin layer.

The sealing method using a ceramic board has some problems. The problems are; high cost of ceramic and incomplete sealing caused in bonding a ceramic board on a substrate to seal a cavity, because the bonding ability between organic materials, for example, a substrate or a bonding agent, and an inorganic material, for example, a ceramic board is inferior, resulting in a decrease in this sealing method one time. Meanwhile, in the encapsulating method by forming the encapsulating resin layer 4 to encapsulate the semiconductor element 3 (FIG. 5), a liquid resin composition is usually employed as a material for forming the encapsulating resin layer 4, which is formed by injecting the liquid resin composition into the cavity. However, when the liquid resin composition is employed, it should be stored at an extremely low temperature (about −40° C. ). Also, since the liquid resin composition must be injected into a suitable position with a suitable amount by using an injector, special apparatus are required to control these conditions. Further, to obtain high fluidity, a liquid material with low moisture-proof reliability or a material containing solvent, which requires low-temperature preheating in curing, is employed, causing a lot of problems in relation to process reliability. Besides, in order to improve fluidity, a material with low content of a filler is employed, wherein a linear expansion coefficient becomes higher and greatly different from that of a semiconductor element, a substrate, a heat sink or the like, resulting in a problem that stress is applied when using.

OBJECT OF THE INVENTION

It is an object of the present invention to provide a method of easily producing a semiconductor device wherein low stress performance and superior moisture-proof reliability can be realized, and an encapsulating pellet employed therein.

DISCLOSURE OF THE INVENTION

In order to achieve the object mentioned above, the first gist of the present invention is a method of producing a semiconductor device comprising; incorporating a semiconductor element into a cavity formed within a substrate, placing a pellet (B) made of the following encapsulating resin composition (A) on the incorporated semiconductor element and heating and melting thereof, and charging the melted encapsulating resin composition into the cavity and curing thereof so as to encapsulate the semiconductor element:

(A) An encapsulating resin composition, which is in a solid state at a normal temperature, containing the following (a) to (c), wherein (c) is set up within the range of not less than 74 weight % and below 90 weight % based on the whole resin composition;
  (a) crystalline epoxy resin
  (b) novolak type phenol resin
  (c) fused silica powder
(B) A pellet having the following characteristic (x);
  (x) when a gram of a cubic pellet is placed on a mirror surface glass plate and heated to be melted at 150° C. for 10 minutes, a flow area is not less than 500 mm$^2$.

Further, the second gist of the present invention is an encapsulating pellet having the following characteristic (x), which comprises the following encapsulating resin composition (A).

(A) An encapsulating resin composition, which shows a solid state at a normal temperature, containing the following (a) to (c), wherein content of the component (c) accounts for not less than 74 weight % and less than 90 weight % based on the whole resin composition.
  (a) crystalline epoxy resin
  (b) novolak type phenol resin
  (c) fused silica powder
    (x) when a gram of a cubic pellet is placed on a mirror surface glass plate and heated to be melted at 150° C. for 10 minutes, a flow area is not less than 500 mm$^2$.

Namely, the present invention relates to a method of producing a semiconductor device comprising incorporating a semiconductor element into a cavity formed within a substrate, placing a pellet (B) made of the above encapsulating resin composition (A), which is in a solid state at a normal temperature, on the incorporated semiconductor element and heating and melting thereof, and charging the melted encapsulating resin composition into the cavity and curing thereof so as to encapsulate the semiconductor element, and an encapsulating pellet employed therein. For this reason, the encapsulating of a semiconductor element with resin can be conducted only by melting a pellet (B) made of an encapsulating resin composition (A), which is in a solid state at a normal temperature, resulting in a simple process. Furthermore, the content of fused silica powder is arranged to be higher within the encapsulating resin composition (A), which decreases the difference in the linear expansion coefficient between the pellet and a semiconductor element or a substrate and low stress performance is imparted so as to prevent occurrence of cracks in an encapsulating resin, a semiconductor element or the like. It is preferable to employ the epoxy resin or the like having the above specific structure as an epoxy resin of the encapsulating resin composition (A), a material for the encapsulating pellet, because a semiconductor device with further superiority in moisture-proof reliability may be obtained. Besides, such a method for producing a semiconductor device is preferably applied to a cavity-fill type such as PPGA or PBGA. In addition, it is more preferable to employ the fused silica powder in a global shape with its maximum diameter of not more than 100 μm, because better fluidity realizes the encapsulating resin composition (A) superior in encapsulating property, which is even better material for forming the encapsulating pellet of the present invention. Among all, the storage at about 5° C. can be achieved, which is easier to be stored than that of the conventional liquid resin composition, by using the epoxy resin having a specific structure and the global fused silica powder with its maximum diameter in a specific range.

Now, the present invention will further be described.

The encapsulating resin composition (A), employed in the method for producing a semiconductor device of the present invention can be obtained by using a specific epoxy resin (component a), novolak type phenol resin (component b) and fused silica powder (component c), is in a semi-hard state and shows a solid state at a normal temperature. For example, by molding the resin composition, wherein the above components are mixed, semi-hard pellets formed into various kinds of shapes are provided. A normal temperature is specifically defined as a temperature within a range of 20 to 50° C. in the present invention.

As the specific epoxy resin (a component), crystalline epoxy resin is employed. Among all, it is preferable to employ such a resin with low melt viscosity. It is especially preferable, from a viewpoint of low melt viscosity, to employ an epoxy resin having each structure represented as the following general formula (1), (2) or (3) respectively. These are employed solely or in combination of two or more.

point is not more than 80° C., more preferably, hydroxyl group equivalent is 90 to 110 g/eq and a softening point is 50 to 70° C., even more preferably, hydroxyl group equivalent is 100 to 110 g/eq and a softening point is 50 to 65° C.

As a mixing ratio of the epoxy resin (component a) and novolak type phenol resin (component b), it is preferable to set up hydroxyl group equivalent of the novolak type phenol resin within a range of 0.5 to 1.6 based on 1 epoxy equivalent of the epoxy resin. It is more preferable to set within a range of 0.8 to 1.2.

As the fused silica powder (component c) employed together with the above component a and component b, it is especially preferable to employ globular fused silica powder so as to bring about high fluidity. As the fused silica powder (component c), it is preferable to employ the powder that the maximum particle diameter is not more than 100 μm, more preferably, not more than 70 μm. The maximum particle diameter may appropriately be established according to a passivation condition of a semiconductor device, a pitch of a wire and sedimentation of a filler component after a resin composition melts and encapsulates. The maximum particle diameter over 100 μm may damage wires within a cavity of a semiconductor device and a semiconductor element surface, or may cause a tendency of incomplete fill ability because pitches among wires are small when there are a lot of wires within a cavity of a multi-pin packaging.

It is necessary to establish the content of the fused silica powder (component c) within a range not less than 74 weight % and less than 90 weight % based on the whole resin composition (A), especially preferably 75 to 85 weight %. Namely, the content less than 74 weight % of the fused silica In the epoxy resin represented as the above general formulae (1) to (3), it is preferable to employ such a resin that epoxy equivalent is 150 to 230 g/eq and a melting point is 60 to 160° C.

As the novolak type phenol resin (component b) employed together with the above epoxy resin (component a), it is preferable to employ the resin with low melt viscosity. Among all, it is preferable to employ the resin that hydroxyl group equivalent is 80 to 120 g/eq and a softening powder may increase a linear expansion coefficient, as a characteristic of hardened encapsulating resin, so that the difference in the coefficient with a semiconductor element may increase, which results in defects such as cracks on a hardened resin, a semiconductor element and the like. On the other hand, the content over 90 weight % may deteriorate fill ability because the melt viscosity of a resin composition increases.

In addition to the above components a to c in the encapsulating resin composition (A) of the present invention, a stress relaxing agent such as silicone compound (for example, side chain ethylene glycol type dimethyl siloxane), flame retardant, polyethylene, wax such as carnauba, coupling agents such as a silane coupling agent (for example, γ-glycidoxy propyl trimethoxysilane) may appropriately be mixed.

As the flame retardant, there is brominated epoxy resin, and also a flame retardant aid such as antimony trioxide may be employed concomitantly.

An encapsulating pellet comprising the encapsulating epoxy resin composition (A) of the present invention is produced, for example, as follows. Namely, the component a and the component b are mixed and melted, and the component c is melted and mixed therein, and other additives may appropriately be mixed, too. Subsequently, a catalyst is added for adjusting reactivity so as to form a homogeneous system, and is directly formed into a sheet (usually 1 mm to 15 mm in thickness), and then is formed into a pellet by punching or the like into a specific shape at a temperature of about 40 to 50° C.

As a catalyst employed for adjusting the reactivity, there is no limitation and any conventional hardening accelerator is acceptable. For example, there are triphenylphosphine, tetraphenylphosphate, tetraphenylborate, 2-methylimidazole and the like.

As methods for mixing the above components and producing the pellet, there is no limitation. For example, it is preferable to adopt a method comprising steps of mixing a resin composition and inorganic filler component (fused silica powder) at 150° C. for 30 minutes in such a metallic container as can be heated from outside and cooling to 120° C., and then adding the catalyst for adjusting reactivity so as to mix thereof homogeneously. Then, this mixture is charged into a pellet and formed into a sheet by casting or the like. Besides, as a method for producing the pellet, in addition to the above punching of a sheet, there is a method of molding. However, it is not preferable to employ a method comprising tableting via powdering when producing a pellet because it is difficult to obtain an aiming value of the flow area of the pellet characteristic (x) mentioned above.

As a shape of the pellet, there is no limitation. For example, there are a cube, a column, a square plate, a globe and the like. The shape is appropriately established in accordance with an object, each size and shape of a cavity formed in a substrate and a semiconductor element. It is especially preferable to employ a cylindrical pellet because it is easy to mount and position a substrate.

Figure 1A:
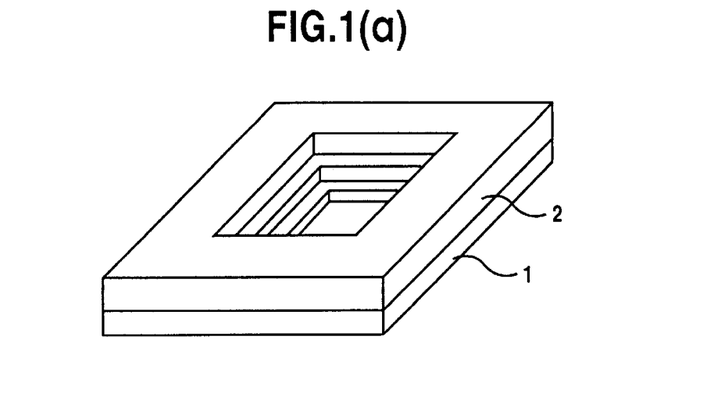
Figure 1B:
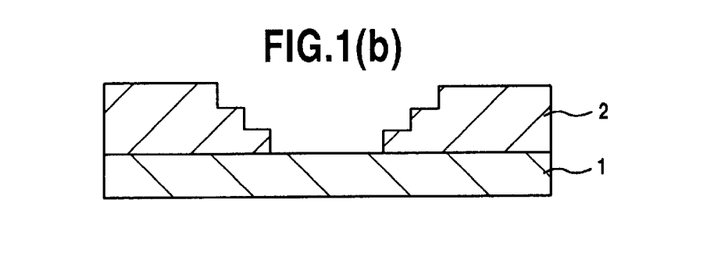
Figure 2:
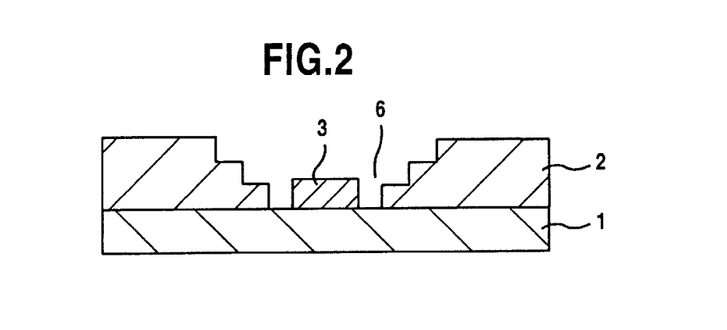
FIG. 2 is a schematic view explaining one embodiment of a method of producing a semiconductor device according to the present invention.
Figure 3:
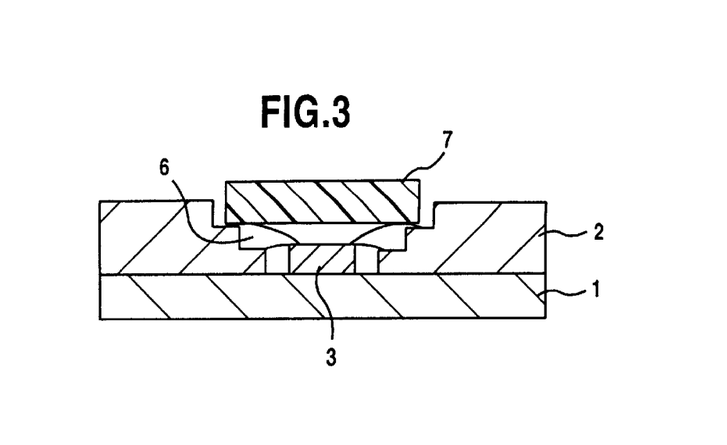
FIG. 3 is a schematic view explaining one embodiment of a method of producing a semiconductor device according to the present invention.
Figure 4:
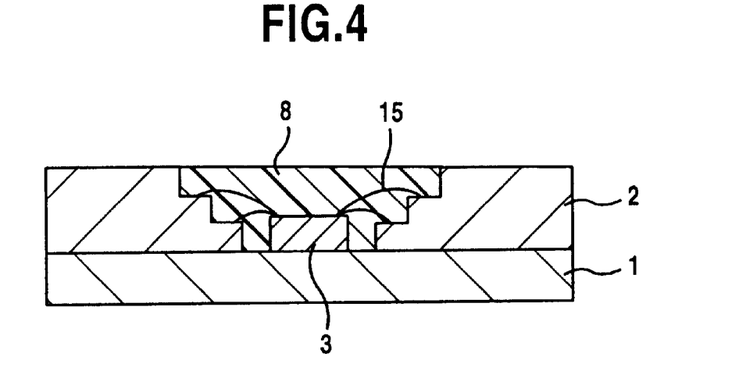
FIG. 4 is a sectional view of a semiconductor device obtained by a method of producing semiconductor device according to the present invention.

A semiconductor device of the present invention is produced, for example, as follows. Namely, as shown in FIGS. 1—(a) and (b), a multiple step-like substrate 2 in a multi-circuit structure having a through hole in its center is adhered to one face of a metallic heat sink 1 so that the entire surface is covered. Consecutively, as shown in FIG. 2, a semiconductor element 3 is mounted usually via an adhesive layer including silver powder within a cavity 6 which is formed by covering the multiple step-like substrate 2 with the metallic heat sink 1. Subsequently, as shown in FIG. 3, the semiconductor element 3 and the substrate 2 are connected by wires, and then a cylindrical pellet 7 comprising the encapsulating resin composition (A) is mounted on the semiconductor element 3. The whole device is heated so that the pellet 7 is melted and the melted encapsulating resin composition (A) is filled and cured within the cavity 6, whereby an encapsulating resin layer 8 can be formed within the cavity 6, as shown in FIG. 4. Thus, a semiconductor device is produced. In FIG. 4, 15 are wires.

It is preferable to set up a temperature of melting the encapsulating resin composition (A), which is a solid state at a normal temperature, at 70 to 250° C. so as not to deteriorate the semiconductor element 3, the substrate 2 and the encapsulating resin composition (A). As a heating method, there are an infrared reflow furnace, a dryer, a hot plate, an air-heating device and the like.

In the encapsulating resin layer 8 formed by encapsulating with the encapsulating resin composition (A), it is preferable that the pellet density of the pellet 7 for forming thereof is not less than 99% based on the true density. Namely, if the pellet density is set up at not less than 99% based on the true density, the air of the pellet is not brought into a hardened material and may not be a cause for forming a void. The pellet density (%) can be obtained by the following equation.

Pellet density (%)=[(a pellet specific gravity)/(a specific gravity of a hardened material)]×100

Furthermore, the pellet 7 comprising the encapsulating resin composition (A) should be provided with a characteristic [characteristic (x) ] that a flow area in melting at 150° C. for 10 minutes is not less than 500 mm² (an atmospheric temperature is 150° C.) after a pellet formed into a gram of a cube using the encapsulating resin composition (A), according to the above method, is mounted on a mirror surface glass plate, which is horizontally positioned. Besides, it is preferable that a gelation time is within 30 minutes at 150° C. and a linear expansion coefficient of the hardened material is not more than 20 ppm/° C. It is more preferable that the flow area is not less than 550 mm² [characteristic (x)], a gelation time is within 15 minutes at 150° C., and the linear coefficient of the hardened material is not more than 19 ppm/° C. Namely, by setting up the flow area at not less than 500 mm², superior encapsulating property and good fill ability can be obtained. Further, since the fused silica powder (component c) as an inorganic filler is highly filled (not less than 74 weight % and less than 90 weight %), occurrence of any defects such as cracking in the hardened resin and the semiconductor element caused by stress can be prevented. Furthermore, the gelation time was measured by using a hot plate cavity and the linear expansion coefficient was measured by using a thermal mechanical analysis (just abbreviated to TMA hereinafter).

As a style of the semiconductor device applied to the method for producing the semiconductor device of the present invention, there are specifically PBGA wherein plural globular bumps are formed on the surface of the substrate 2 shown in FIG. 5, PPGA wherein plural globular pins are formed on the surface of the substrate 2, and the like.

EFFECTS OF THE INVENTION

As mentioned above, the present invention relates to a method of producing a semiconductor device comprising incorporating a semiconductor element into a cavity formed within a substrate, placing a pellet (B) made of the above encapsulating resin composition (A), which is in a solid state at a normal temperature, on the incorporated semiconductor element and heating and melting thereof, and charging the melted encapsulating resin composition (A) into the cavity and curing thereof so as to encapsulate the semiconductor element, and an encapsulating pellet employed therein. In this way, the encapsulating of a semiconductor element with resin can be conducted only by melting a special pellet (B) made of an encapsulating resin composition (A), which is in a solid state at a normal temperature, resulting in a simple process. In addition, the pellet (B) made of the encapsulating resin composition (A) showing a solid state at a normal temperature does not need storage at such an extremely low temperature as required for a conventional liquid resin composition, resulting in easier storage. Furthermore, the content of fused silica powder is arranged to be higher within the encapsulating resin composition (A), which decreases the difference in the linear expansion coefficient between the pellet and a semiconductor element or a substrate and low stress performance is imparted so as to prevent occurrence of cracks in an encapsulating resin, a semiconductor element or the like. It is preferable to employ the epoxy resin or the like having the structure represented by the general formulae (1) to (3), especially (1), as an epoxy resin of the encapsulating resin composition (A), a material for the encapsulating pellet, because a semiconductor device with further superiority in moisture-proof reliability may be obtained. Besides, such a method for producing a semiconductor device is preferably applied to a cavity-fill type such as PPGA or PBGA. In addition, it is more preferable to employ the fused silica powder in a global shape with its maximum diameter of not more than 100 μm, because the encapsulating resin composition (A) superior in fill ability within the cavity can be obtained, which is even better material for producing the semiconductor device of the present invention.

BRIEF DESCRIPTION OF THE DRAWINGS

FIG. 1—(a) is a perspective view illustrating one embodiment of a method of producing a semiconductor device according to the present invention and (b) is a sectional view thereof, FIG. 7—(a) is a perspective view illustrating a process of producing samples for checking charging effect and (b) is a sectional view thereof.

BEST MODE FOR CARRYING OUT THE INVENTION

Now, the present invention will further be described in the following examples with reference to comparative examples.

First, prior to examples, the following components were prepared.

[Epoxy resin a1]

A biphenyl type epoxy resin having a structure represented as the following general formula (4).

Epoxy equivalent: 195 g/eq, Melting point: 107° C.

[Epoxy resin a2]

An epoxy resin having a structure represented as the following general formula (5).

Epoxy equivalent: 182 g/eq, Melting point: 140° C.

[Epoxy resin a3]

A biphenyl type epoxy resin having a structure represented as the following general formula (6).

Epoxy equivalent: 190 g/eq, Melting point: 80° C.
[Epoxy resin a4]
A liquid bisphenol type epoxy resin (epoxy equivalent: 190 g/eq).
[Hardener b1]
A novolak type phenol resin (hydroxyl group equivalent: 107 g/eq, a softening point: 58° C.)
[Hardener b2]
A liquid methylated hexahydro phthalic acid (hydroxyl group equivalent: 168 g/eq)
[Hardener b3]
A liquid allyl phenol (hydroxyl group equivalent: 146 g/eq).
[Silica powder c1 to c6]
Silica powder (fused silica powder) shown in the following Table 1.

TABLE 1

| SILICA POWDER | MAXIMUM PARTICLE DIAMETER (μm) | SHAPE |
|---|---|---|
| c1 | 100 | globular form |
| c2 | 100 | globular form |
| c3 | 140 | globular form |
| c4 | 40 | globular form |
| c5 | 100 | mixture of globular/crushed forms |
| c6 | 100 | crushed form |

[Catalyst d1]
Triphenylphosphine
[Catalyst d2]
A mixture of tetraphenylphosphate and tetraphynylborate (molar mixing ratio: 1/1).
[Catalyst d3]
2-methylimidazole.
[Flame retardant]
Brominated epoxy phenol novolak
[Flame retardant aid]
Antimony trioxide
[Wax]
Polyethylene
[Silicone compound]
Side chain ethylene glycol type dimethyl siloxane
[Coupling agent]
γ-glycidoxy propyl trimethoxysilane

EXAMPLES 1–15, COMPARATIVE EXAMPLES 1–27, 33–37

Each of the above components was mixed at a specific ratio shown in Tables 2 to 7 respectively. Such a mixture was directly formed into a sheet by casting, which was punched into an encapsulating pellet (in a cylindrical shape) at 40° C. after cooling. Besides, as comparative examples, pellets wherein a flow area, which is one of the physical characteristics for the encapsulating pellet, is less than 500 mm$^2$ were employed. This was produced by crushing the mixture after cooling and punching into a cylindrical shape. Every encapsulating pellet produced not via the crushing process showed pellet density of not less than 99% based on the true density.

COMPARATIVE EXAMPLES 28–32

Each of the above components was mixed at a specific ratio shown in Table 7 so as to produce liquid encapsulating resin.

TABLE 2

| | (parts by weight) EXAMPLES | | | | | | | | |
|---|---|---|---|---|---|---|---|---|---|
| | 1 | 2 | 3 | 4 | 5 | 6 | 7 | 8 | 9 |
| EPOXY RESIN | | | | | | | | | |
| a1 | 17 | — | — | 19 | — | — | 16 | — | — |
| a2 | — | 17 | — | — | 19 | — | — | 16 | — |
| a3 | — | — | 17 | — | — | 19 | — | — | 16 |
| a4 | — | — | — | — | — | — | — | — | — |
| HARDENER | | | | | | | | | |
| b1 | 10 | 10 | 10 | 11 | 11 | 11 | 10 | 10 | 10 |
| b2 | — | — | — | — | — | — | — | — | — |
| b3 | — | — | — | — | — | — | — | — | — |
| SILICA POWDER | | | | | | | | | |
| c1 | 95 | 95 | 95 | — | — | — | 95 | 95 | 95 |
| c2 | — | — | — | 100 | 100 | 100 | — | — | — |
| c3 | — | — | — | — | — | — | — | — | — |
| CATALYST | | | | | | | | | |
| d1 | 1 | 1 | 1 | 1 | 1 | 1 | — | — | — |
| d2 | — | — | — | — | — | — | 2 | 2 | 2 |
| d3 | — | — | — | — | — | — | — | — | — |
| FLAME RETARDANT | 2.5 | 2.5 | 2.5 | 2.5 | 2.5 | 2.5 | 2.5 | 2.5 | 2.5 |
| FLAME RETARDANT AID | 5.0 | 5.0 | 5.0 | 5.0 | 5.0 | 5.0 | 5.0 | 5.0 | 5.0 |
| WAX | 0.5 | 0.5 | 0.5 | 0.5 | 0.5 | 0.5 | 0.5 | 0.5 | 0.5 |
| SILICONE | 1.3 | 1.3 | 1.3 | 1.3 | 1.3 | 1.3 | 1.3 | 1.3 | 1.3 |
| COUPLING AGENT | 0.3 | 0.3 | 0.3 | 0.3 | 0.3 | 0.3 | 0.3 | 0.3 | 0.3 |

TABLE 2-continued

| | (parts by weight) EXAMPLES | | | | | | | | |
|---|---|---|---|---|---|---|---|---|---|
| | 1 | 2 | 3 | 4 | 5 | 6 | 7 | 8 | 9 |
| CHARGING AMOUNT OF SILICA POWDER (weight %) | 75 | 75 | 75 | 75 | 75 | 75 | 75 | 75 | 75 |
| METHOD OF FORMING PELLET | sheet punching | | | | | | | | |

TABLE 3

| | (parts by weight) EXAMPLES | | | | | |
|---|---|---|---|---|---|---|
| | 10 | 11 | 12 | 13 | 14 | 15 |
| EPOXY RESIN | | | | | | |
| a1 | 19 | — | — | 17 | — | — |
| a2 | — | 19 | — | — | 17 | — |
| a3 | — | — | 19 | — | — | 17 |
| a4 | — | — | — | — | — | — |
| HARDENER | | | | | | |
| b1 | 10 | 10 | 10 | 10 | 10 | 10 |
| b2 | — | — | — | — | — | — |
| SILICA POWDER | | | | | | |
| c1 | 275 | 275 | 275 | — | — | — |
| c2 | — | — | — | — | — | — |
| c3 | — | — | — | — | — | — |
| c4 | — | — | — | 95 | — | — |
| c5 | — | — | — | — | 95 | — |
| c6 | — | — | — | — | — | 95 |

TABLE 3-continued

| | (parts by weight) EXAMPLES | | | | | |
|---|---|---|---|---|---|---|
| | 10 | 11 | 12 | 13 | 14 | 15 |
| CATALYST | | | | | | |
| d1 | 1 | 1 | 1 | — | — | — |
| d2 | — | — | — | 1 | 1 | 1 |
| FLAME RETARDANT | 2.5 | 2.5 | 2.5 | 2.5 | 2.5 | 2.5 |
| FLAME RETARDANT AID | 5.0 | 5.0 | 5.0 | 5.0 | 5.0 | 5.0 |
| WAX | 0.5 | 0.5 | 0.5 | 0.5 | 0.5 | 0.5 |
| SILICONE | 1.3 | 1.3 | 1.3 | 1.3 | 1.3 | 1.3 |
| COUPLING AGENT | 0.3 | 0.3 | 0.3 | 0.3 | 0.3 | 0.3 |
| CHARGING AMOUNT OF SILICA POWDER (weight %) | 88 | 88 | 88 | 75 | 75 | 75 |
| METHOD OF FORMING PELLET | sheet punching | | | | | |

TABLE 4

| | (parts by weight) COMPARATIVE EXAMPLES | | | | | | | | |
|---|---|---|---|---|---|---|---|---|---|
| | 1 | 2 | 3 | 4 | 5 | 6 | 7 | 8 | 9 |
| EPOXY RESIN | | | | | | | | | |
| a1 | 17 | — | — | 19 | — | — | 16 | — | — |
| a2 | — | 17 | — | — | 19 | — | — | 16 | — |
| a3 | — | — | 17 | — | — | 19 | — | — | 16 |
| a4 | — | — | — | — | — | — | — | — | — |
| HARDENER | | | | | | | | | |
| b1 | 10 | 10 | 10 | 11 | 11 | 11 | 10 | 10 | 10 |
| b2 | — | — | — | — | — | — | — | — | — |
| b3 | — | — | — | — | — | — | — | — | — |
| SILICA POWDER | | | | | | | | | |
| c1 | 72 | 72 | 72 | 69 | 69 | 69 | 72 | 72 | 72 |
| c2 | — | — | — | — | — | — | — | — | — |
| c3 | — | — | — | — | — | — | — | — | — |

TABLE 4-continued

| | (parts by weight) COMPARATIVE EXAMPLES | | | | | | | | |
|---|---|---|---|---|---|---|---|---|---|
| | 1 | 2 | 3 | 4 | 5 | 6 | 7 | 8 | 9 |
| CATALYST | | | | | | | | | |
| d1 | 1 | 1 | 1 | 1 | 1 | 1 | — | — | — |
| d2 | — | — | — | — | — | — | 2 | 2 | 2 |
| FLAME RETARDANT | 2.5 | 2.5 | 2.5 | 2.5 | 2.5 | 2.5 | 2.5 | 2.5 | 2.5 |
| FLAME RETARDANT AID | 5.0 | 5.0 | 5.0 | 5.0 | 5.0 | 5.0 | 5.0 | 5.0 | 5.0 |
| WAX | 0.5 | 0.5 | 0.5 | 0.5 | 0.5 | 0.5 | 0.5 | 0.5 | 0.5 |
| SILICONE | 1.3 | 1.3 | 1.3 | 1.3 | 1.3 | 1.3 | 1.3 | 1.3 | 1.3 |
| COUPLING AGENT | 0.3 | 0.3 | 0.3 | 0.3 | 0.3 | 0.3 | 0.3 | 0.3 | 0.3 |
| CHARGING AMOUNT OF SILICA POWDER (weight %) | 70 | 70 | 70 | 68 | 68 | 68 | 70 | 70 | 70 |
| METHOD OF FORMING PELLET | | | | | | | | | |
| COMPARATIVE EXAMPLES | 1–3 and 7–9: crushing and tableting 4–6: sheet punching | | | | | | | | |

TABLE 5

| | (parts by weight) COMPARATIVE EXAMPLES | | | | | | | | |
|---|---|---|---|---|---|---|---|---|---|
| | 10 | 11 | 12 | 13 | 14 | 15 | 16 | 17 | 18 |
| EPOXY RESIN | | | | | | | | | |
| a1 | 19 | — | — | 16 | — | — | 16 | — | — |
| a2 | — | 19 | — | — | 16 | — | — | 16 | — |
| a3 | — | — | 19 | — | — | 16 | — | — | 16 |
| a4 | — | — | — | — | — | — | — | — | — |
| HARDENER | | | | | | | | | |
| b1 | 10 | 10 | 10 | 10 | 10 | 10 | 10 | 10 | 10 |
| b2 | — | — | — | — | — | — | — | — | — |
| b3 | — | — | — | — | — | — | — | — | — |
| SILICA POWDER | | | | | | | | | |
| c1 | 69 | 69 | 69 | — | — | — | — | — | — |
| c2 | — | — | — | 72 | 72 | 72 | — | — | — |
| c3 | — | — | — | — | — | — | 72 | 72 | 72 |
| c4 | — | — | — | — | — | — | — | — | — |
| CATALYST | | | | | | | | | |
| d1 | — | — | — | — | — | — | — | — | — |
| d2 | 2 | 2 | 2 | 2 | 2 | 2 | 2 | 2 | 2 |
| FLAME RETARDANT | 2.5 | 2.5 | 2.5 | 2.5 | 2.5 | 2.5 | 2.5 | 2.5 | 2.5 |
| FLAME RETARDANT AID | 5.0 | 5.0 | 5.0 | 5.0 | 5.0 | 5.0 | 5.0 | 5.0 | 5.0 |
| WAX | 0.5 | 0.5 | 0.5 | 0.5 | 0.5 | 0.5 | 0.5 | 0.5 | 0.5 |
| SILICONE | 1.3 | 1.3 | 1.3 | 1.3 | 1.3 | 1.3 | 1.3 | 1.3 | 1.3 |
| COUPLING AGENT | 0.3 | 0.3 | 0.3 | 0.3 | 0.3 | 0.3 | 0.3 | 0.3 | 0.3 |
| CHARGING AMOUNT OF SILICA POWDER (weight %) | 68 | 68 | 68 | 70 | 70 | 70 | 70 | 70 | 70 |
| METHOD OF FORMING PELLET | | | | | | | | | |
| COMPARATIVE EXAMPLES | 10–12: sheet punching 13–18: crushing and tableting | | | | | | | | |

TABLE 6

| (parts by weight) COMPARATIVE EXAMPLES | 19 | 20 | 21 | 22 | 23 | 24 | 25 | 26 | 27 |
|---|---|---|---|---|---|---|---|---|---|
| EPOXY RESIN | | | | | | | | | |
| a1 | 19 | — | — | 16 | — | — | 16 | — | — |
| a2 | — | 19 | — | — | 16 | — | — | 16 | — |
| a3 | — | — | 19 | — | — | 16 | — | — | 16 |
| a4 | — | — | — | — | — | — | — | — | — |
| HARDENER | | | | | | | | | |
| b1 | 10 | 10 | 10 | 10 | 10 | 10 | 10 | 10 | 10 |
| b2 | — | — | — | — | — | — | — | — | — |
| SILICA POWDER | | | | | | | | | |
| c1 | 31 | 275 | 275 | — | — | — | — | — | — |
| c2 | — | — | — | — | — | — | — | — | — |
| c3 | — | — | — | 31 | 31 | 31 | 275 | 275 | 275 |
| c4 | — | — | — | — | — | — | — | — | — |
| CATALYST | | | | | | | | | |
| d1 | 1 | 1 | 1 | 1 | 1 | 1 | 1 | 1 | 1 |
| d2 | — | — | — | — | — | — | — | — | — |
| FLAME RETARDANT | 2.5 | 2.5 | 2.5 | 2.5 | 2.5 | 2.5 | 2.5 | 2.5 | 2.5 |
| FLAME RETARDANT AID | 5.0 | 5.0 | 5.0 | 5.0 | 5.0 | 5.0 | 5.0 | 5.0 | 5.0 |
| WAX | 0.5 | 0.5 | 0.5 | 0.5 | 0.5 | 0.5 | 0.5 | 0.5 | 0.5 |
| SILICONE | 1.3 | 1.3 | 1.3 | 1.3 | 1.3 | 1.3 | 1.3 | 1.3 | 1.3 |
| COUPLING AGENT | 0.3 | 0.3 | 0.3 | 0.3 | 0.3 | 0.3 | 0.3 | 0.3 | 0.3 |
| CHARGING AMOUNT OF SILICA POWDER (weight %) | 51 | 88 | 88 | 51 | 51 | 51 | 90 | 90 | 90 |
| METHOD OF FORMING PELLET | crushing and tableting | | | | | | | | |

TABLE 7

| (parts by weight) COMPARATIVE EXAMPLES | 28 | 29 | 30 | 31 | 32 | 33 | 34 | 35 | 36 | 37 |
|---|---|---|---|---|---|---|---|---|---|---|
| EPOXY RESIN | | | | | | | | | | |
| a1 | — | — | — | — | — | 16 | 16 | — | — | — |
| a2 | — | — | — | — | — | — | — | 16 | — | — |
| a3 | — | — | — | — | — | — | — | — | 16 | 16 |
| a4 | 14 | 14 | 14 | 14 | 14 | — | — | — | — | — |
| HARDENER | | | | | | | | | | |
| b1 | — | — | — | — | — | 10 | 10 | 10 | 10 | 10 |
| b2 | 13 | — | 13 | 13 | 13 | — | — | — | — | — |
| b3 | — | 13 | — | — | — | — | — | — | — | — |
| SILICA POWDER | | | | | | | | | | |
| c1 | — | — | — | — | — | 25 | 350 | 25 | 350 | 72 |
| c2 | — | — | — | — | 72 | — | — | — | — | — |
| c3 | — | — | — | — | — | — | — | — | — | — |
| c4 | — | — | 275 | — | — | — | — | — | — | — |
| c5 | 72 | 72 | — | — | — | — | — | — | — | — |
| c6 | — | — | — | 72 | — | — | — | — | — | — |
| CATALYST | | | | | | | | | | |
| d1 | — | — | — | — | — | 1 | 1 | 1 | 1 | 1 |
| d2 | — | — | — | — | — | — | — | — | — | — |
| d3 | 1 | 1 | 1 | 1 | 1 | — | — | — | — | — |
| FLAME RETARDANT | 2.5 | 2.5 | 2.5 | 2.5 | 2.5 | 2.5 | 2.5 | 2.5 | 2.5 | 2.5 |
| FLAME RETARDANT AID | 5.0 | 5.0 | 5.0 | 5.0 | 5.0 | 5.0 | 5.0 | 5.0 | 5.0 | 5.0 |
| WAX | 0.5 | 0.5 | 0.5 | 0.5 | 0.5 | 0.5 | 0.5 | 0.5 | 0.5 | 0.5 |
| SILICONE | 1.3 | 1.3 | 1.3 | 1.3 | 1.3 | 1.3 | 1.3 | 1.3 | 1.3 | 1.3 |
| COUPLING | 0.3 | 0.3 | 0.3 | 0.3 | 0.3 | 0.3 | 0.3 | 0.3 | 0.3 | 0.3 |
| AGENT CHARGING AMOUNT OF SILICA POWDER (weight %) | 70 | 70 | 88 | 70 | 70 | 49 | 92 | 49 | 92 | 70 |
| METHOD OF FORMING PELLET | | | | | | | | | | |

Figure 6:
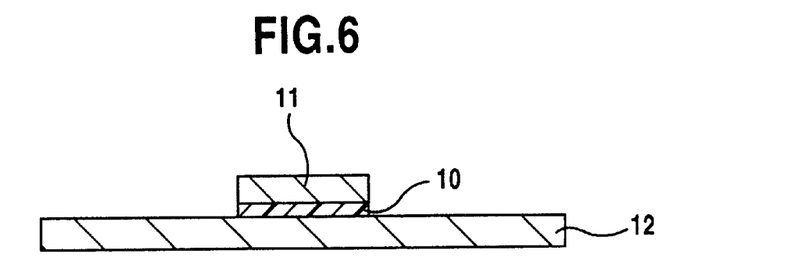
FIG. 6 is a schematic view illustrating a process of producing samples for checking charging effect.
Figure 7A:
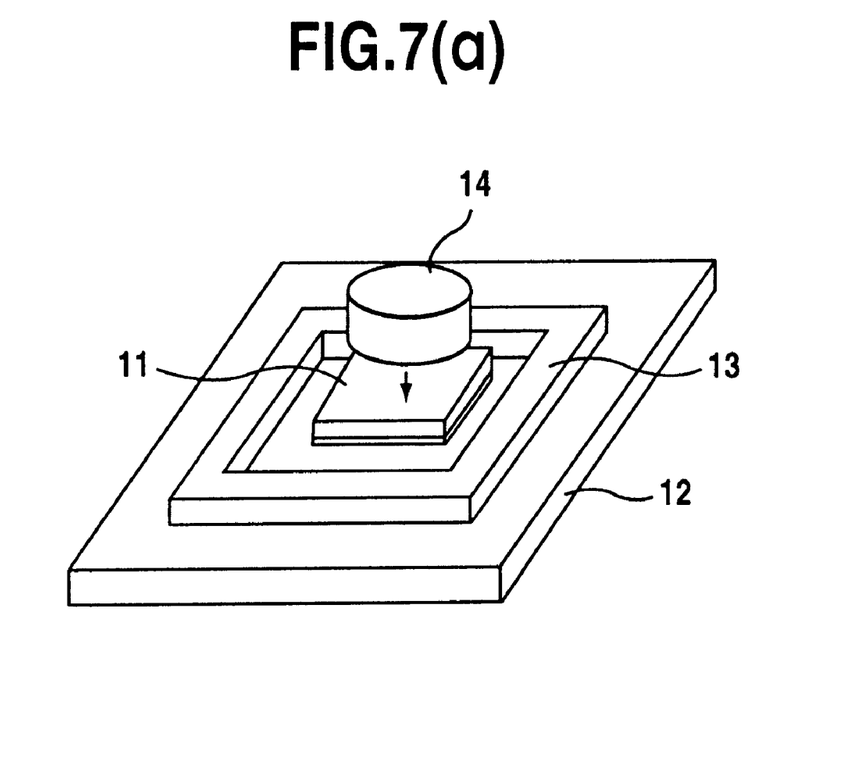
Figure 7B:
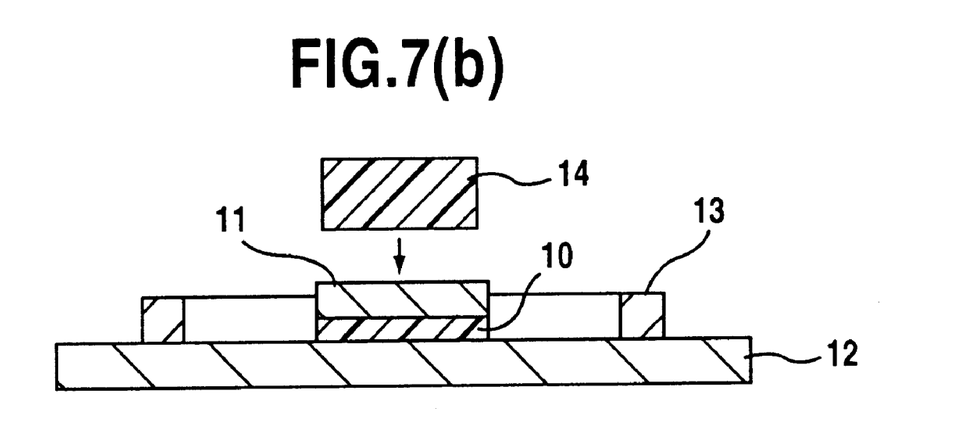

COMPARATIVE EXAMPLES
28–32: liquid
33–34: crushing and tableting
35–37: sheet punching By employing each of thus obtained cylindrical pellets (Examples 1 to 15, Comparative Examples 1 to 27 and 33 to 37) and liquid resin (Comparative Examples 28 to 32), samples similar to the semiconductor device for checking charging effect as follows. First, each silicon chip in 15×15× 0.37 mm (thickness) was prepared respectively. Then, as shown in FIG. 6, by employing die attach material 10 (Ag paste, EN-4000), the above silicon chip 11 was adhered to a glass sheet 12 (40×40 mm). As shown in FIG. 7 (*a*) and (*b*), a dam 13 shaped in a square frame (inside dimensions: 25×25 mm, 1 mm in thickness) was adhered to the glass sheet 12 so that each side of the dam 13 is equally distant from a silicon chip 11 aligned at the center, and then a pellet 14 (diameter 10 mm×7 mm in thickness) was mounted on the silicon chip 11. Besides, in using liquid resin, the liquid resin was charged into a syringe and 0.55 cc thereof was dropped. This was allowed to stand in an oven at 150° C. for 30 minutes so that the pellet 14 was melted. Subsequently, the encapsulating resin composition in a melted state was filled in a dam 13 and cured so that the silicon chip 11 was resin-encapsulated. Then, whether the melted resin composition or liquid resin was completely filled into the dam 13 or not was observed with visual inspection from the both of the reverse and surface sides of the glass sheet 12. As a result, those which were completely filled are marked with ◯, and those which were filled over 90% but less than 100% are Δ, and then those which were filled at less than 90% are X. Furthermore, a void status on the encapsulated parts was identified by overview visual inspection. As a result, those in which no void was identified are marked with ◯, while those in which void was clearly identified are X.

Consecutively, by using each pellet and liquid resin of the Examples and Comparative Examples, each package for evaluation of moisture-proof reliability in a state of dual-in-line package (DIP) was produced by transfer molding (molding condition: 160° C.×10 minutes+175° C.×300 minutes after curing). By using the packages, a device corrosion test (Pressure Cocker Bias Test, just abbreviated to PCBT hereinafter) was conducted with a bias of 130° C.×85%×30 V, those whose fraction defective was less than 50% in 200 hours are marked with ◯, those with not less than 50% are X. The results are shown in the following Tables 8 to 14.

Besides, by melting each pellet and liquid resin of the Examples and Comparative Examples to be cured (conditions: 175° C.×5 hours), each linear expansion coefficient was measured by using a conventional thermal mechanical analysis (TMA). Further, each gelation time was measured in accordance with the above mentioned method. These results are shown in the following Tables 8 to 14.

In addition, each pellet and liquid resin of Examples and Comparative Examples were transfer-molded (conditions: 160° C.×10 minutes+175° C.×300 minutes after curing) into a package of DIP-16 pin form using a silicon chip attached with a silica oxide film of 10×5 mm. Consecutively, the package was subjected to a thermal shock test (just abbreviated to TST hereinafter) comprising 100 cycles of −65° C.×5 minutes and 150° C.×5 minutes (liquid to liquid), and the package was opened, and then the number of passivation cracking of the chip surface oxide layer was counted. These results are shown in the following Tables 8 to 14. Further, the linear expansion coefficient of the hardened rersin was established at not more than 20 ppm/° C. by considering the degree of passivation cracking of the chip surface oxide layer by the above TST.

TABLE 8

|  | EXAMPLES | | | | | | | |
|---|---|---|---|---|---|---|---|---|
|  | 1 | 2 | 3 | 4 | 5 | 6 | 7 | 8 |
| FILL ABILITY | ◯ | ◯ | ◯ | ◯ | ◯ | ◯ | ◯ | ◯ |
| VOID STATUS | ◯ | ◯ | ◯ | ◯ | ◯ | ◯ | ◯ | ◯ |
| MTTF OF PCBT (200 hours) | ◯ | ◯ | ◯ | ◯ | ◯ | ◯ | ◯ | ◯ |
| GELATION TIME (*1) | 4 | 4 | 4 | 4 | 4 | 4 | 4 | 4 |
| LINEAR EXPANSION COEFFICIENT (*2) | 18 | 18 | 19 | 19 | 20 | 19 | 19 | 18 |
| FLOWING AREA (*3) | 870 | 900 | 890 | 790 | 800 | 750 | 850 | 880 |
| PASSIVATION CRACK NO. OF TST (100 CYCLES) | 5 | 5 | 7 | 7 | 10 | 7 | 8 | 3 |

NB: (*1); Unit is the minute and gelation time was measured at 150° C.
(*2); Unit is ppm/° C. and linear expansion coefficient was measured at 25 to 100° C.
(*3); Unit is mm² and flow area was measured by putting a gram of a cubic pellet on a mirror surface glass at 150° C. for 10 minutes.

TABLE 9

|  | EXAMPLES | | | | | | |
|---|---|---|---|---|---|---|---|
|  | 9 | 10 | 11 | 12 | 13 | 14 | 15 |
| FILL ABILITY | ◯ | ◯ | ◯ | ◯ | ◯ | ◯ | ◯ |
| VOID STATUS | ◯ | ◯ | ◯ | ◯ | ◯ | ◯ | ◯ |
| MTTF OF PCBT (200 hours) | ◯ | ◯ | ◯ | ◯ | ◯ | ◯ | ◯ |
| GELATION TIME (*1) | 4 | 4 | 4 | 4 | 4 | 4 | 4 |
| LINEAR EXPANSION COEFFICIENT (*2) | 19 | 12 | 12 | 12 | 19 | 19 | 19 |
| FLOWING AREA (*3) | 820 | 530 | 560 | 550 | 610 | 570 | 510 |
| PASSIVATION CRACK NO. OF TST (100 CYCLES) | 7 | 2 | 0 | 0 | 5 | 7 | 6 |

NB: (*1); Unit is the minute and gelation time was measured at 150° C.
(*2); Unit is ppm/° C. and linear expansion coefficient was measured at 25 to 100° C.
(*3); Unit is mm² and flow area was measured by putting a gram of a cubic pellet on a mirror surface glass at 150° C. for 10 minutes.

TABLE 10

|  | COMPARATIVE EXAMPLES | | | | | | | |
|---|---|---|---|---|---|---|---|---|
|  | 1 | 2 | 3 | 4 | 5 | 6 | 7 | 8 |
| FILL ABILITY | X | X | X | ◯ | ◯ | ◯ | X | X |
| VOID STATUS | ◯ | ◯ | ◯ | ◯ | ◯ | ◯ | ◯ | ◯ |
| MTTF OF PCBT (200 hours) | ◯ | ◯ | ◯ | ◯ | ◯ | ◯ | ◯ | ◯ |

TABLE 10-continued

|  | COMPARATIVE EXAMPLES | | | | | | | |
| --- | --- | --- | --- | --- | --- | --- | --- | --- |
|  | 1 | 2 | 3 | 4 | 5 | 6 | 7 | 8 |
| GELATION TIME (*1) | 4 | 4 | 4 | 4 | 4 | 4 | 4 | 4 |
| LINEAR EXPANSION COEFFICIENT (*2) | 21 | 21 | 21 | 22 | 22 | 22 | 21 | 21 |
| FLOWING AREA (*3) | 350 | 380 | 320 | 880 | 950 | 820 | 300 | 350 |
| PASSIVATION CRACK NO. OF TST (100 CYCLES) | 20 | 25 | 30 | 40 | 35 | 30 | 30 | 27 |

NB: (*1); Unit is the minute and gelation time was measured at 150° C.
(*2); Unit is ppm/° C. and linear expansion coefficient was measured at 25 to 100° C.
(*3); Unit is mm$^2$ and flow area was measured by putting a gram of a cubic pellet on a mirror surface glass at 150° C. for 10 minutes.

TABLE 11

|  | COMPARATIVE EXAMPLES | | | | | | | |
| --- | --- | --- | --- | --- | --- | --- | --- | --- |
|  | 9 | 10 | 11 | 12 | 13 | 14 | 15 | 16 |
| FILL ABILITY | x | ○ | ○ | ○ | x | x | x | x |
| VOID STATUS | ○ | ○ | ○ | ○ | ○ | ○ | ○ | ○ |
| MTTF OF PCBT (200 hours) | ○ | ○ | ○ | ○ | ○ | ○ | ○ | ○ |
| GELATION TIME (*1) | 4 | 4 | 4 | 4 | 4 | 4 | 4 | 4 |
| LINEAR EXPANSION COEFFICIENT (*2) | 21 | 21 | 21 | 21 | 22 | 22 | 22 | 21 |
| FLOWING AREA (*3) | 300 | 800 | 900 | 750 | 300 | 340 | 280 | 420 |
| PASSIVATION CRACK NO. OF TST (100 CYCLES) | 21 | 50 | 40 | 35 | 51 | 38 | 60 | 18 |

NB: (*1); Unit is the minute and gelation time was measured at 150° C.
(*2); Unit is ppm/° C. and linear expansion coefficient was measured at 25 to 100° C.
(*3); Unit is mm$^2$ and flow area was measured by putting a gram of a cubic pellet on a mirror surface glass at 150° C. for 10 minutes.

TABLE 12

|  | COMPARATIVE EXAMPLES | | | | | | | |
| --- | --- | --- | --- | --- | --- | --- | --- | --- |
|  | 17 | 18 | 19 | 20 | 21 | 22 | 23 | 24 |
| FILL ABILITY | x | x | ○ | x | x | ○ | ○ | ○ |
| VOID STATUS | ○ | ○ | ○ | ○ | ○ | ○ | ○ | ○ |
| MTTF OF PCBT (200 hours) | ○ | ○ | ○ | ○ | ○ | ○ | ○ | ○ |
| GELATION TIME (*1) | 4 | 4 | 4 | 4 | 4 | 4 | 4 | 4 |
| LINEAR EXPANSION COEFFICIENT (*2) | 21 | 21 | 53 | 12 | 12 | 50 | 50 | 50 |
| FLOWING AREA (*3) | 450 | 370 | 650 | 150 | 130 | 520 | 550 | 580 |
| PASSIVATION CRACK NO. OF TST (100 CYCLES) | 30 | 21 | >100 | 3 | 1 | >100 | >100 | >100 |

NB: (*1); Unit is the minute and gelation time was measured at 150° C.
(*2); Unit is ppm/° C. and linear expansion coefficient was measured at 25 to 100° C.
(*3); Unit is mm$^2$ and flow area was measured by putting a gram of a cubic pellet on a mirror surface glass at 150° C. for 10 minutes.

TABLE 13

|  | COMPARATIVE EXAMPLES | | | | | | | |
| --- | --- | --- | --- | --- | --- | --- | --- | --- |
|  | 25 | 26 | 27 | 28 | 29 | 30 | 31 | 32 |
| FILL ABILITY | x | x | x | ○ | ○ | ○ | ○ | ○ |
| VOID STATUS | ○ | ○ | ○ | x | x | x | x | x |
| MTTF OF PCBT (200 hours) | ○ | ○ | ○ | x | x | x | x | x |
| GELATION TIME (*1) | 4 | 4 | 4 | 4 | 4 | 4 | 4 | 4 |
| LINEAR EXPANSION COEFFICIENT (*2) | 11 | 11 | 11 | 22 | 22 | 12 | 22 | 22 |
| FLOWING AREA (*3) | 180 | 170 | 150 | 950 | 870 | 560 | 880 | 780 |
| PASSIVATION CRACK NO. OF TST (100 CYCLES) | 0 | 2 | 3 | 58 | 70 | 7 | 63 | 60 |

NB: (*1); Unit is the minute and gelation time was measured at 150° C.
(*2); Unit is ppm/°C. and linear expansion coefficient was measured at 25 to 100° C.
(*3); Unit is mm$^2$ and flow area was measured by putting a gram of a cubic pellet on a mirror surface glass at 150° C. for 10 minutes.

TABLE 14

| | COMPARATIVE EXAMPLES | | | | |
|---|---|---|---|---|---|
| | 33 | 34 | 35 | 36 | 37 |
| FILL ABILITY | ○ | x | ○ | x | ○ |
| VOID STATUS | ○ | ○ | ○ | ○ | ○ |
| MTTF OF PCBT (200 hours) | ○ | ○ | ○ | ○ | ○ |
| GELATION TIME (*1) | 4 | 4 | 4 | 4 | 4 |
| LINEAR EXPANSION COEFFICIENT (*2) | 55 | 20 | 55 | 20 | 23 |
| FLOWING AREA (*3) | 680 | 100 | 990 | 450 | 800 |
| PASSIVATION CRACK NO. OF TST (100 CYCLES) | >100 | 10 | >100 | 8 | 38 |

NB: (*1); Unit is the minute and gelation time was measured at 150° C.
(*2); Unit is ppm/°C. and linear expansion coefficient was measured at 25 to 100° C.
(*3); Unit is mm² and flow area was measured by putting a gram of a cubic pellet on a mirror surface glass at 150° C. for 10 minutes.

From the results of the above Tables 8 to 14, all Examples were well filled and superior in reliability because it takes longer time on an average to cause troubles in PCBT. Further, the number of passivation cracks of Examples at TST are relatively less than that of Comparative Examples. Furthermore, low stress performance was turned out to be superior because a linear expansion coefficient (or rate) of a characteristic for the cured resin was not more than 20 ppm/° C. On the other hand, each Comparative Example was inferior in either of fill ability (flowing efficiency), moisture-proof reliability, or linear expansion property (the number of passivation cracks at TCT).

What is claimed is:

1. A method of producing a semiconductor device comprising;
   incorporating a semiconductor element into a cavity formed within a substrate,
   placing a pellet (B) made of the following encapsulating resin composition (A) on the incorporated semiconductor element and heating and melting thereof,
   and charging the melted encapsulating resin composition (A) into the cavity and curing thereof so as to encapsulate the semiconductor element:
   (A) An encapsulating resin composition, which is in a solid state at a normal temperature, containing the following (a) to (c), wherein (c) is set up within the range of not less than 74 weight % and below 90 weight % based on the whole resin composition;
   (a) crystalline epoxy resin
   (b) novolak type phenol resin
   (c) fused silica powder
   (B) A pellet having the following characteristic (x);
   (x) when a gram of a cubic pellet is placed on a mirror surface glass plate and heated to be melted at 150° C. for 10 minutes, a flow area is not less than 500 mm².

2. A method of producing a semiconductor device according to claim 1, wherein an average linear expansion coefficient of the cured encapsulating resin made of the encapsulating resin composition (A) in the range of 25 to 100° C. is not more than 20 ppm/° C.

3. A method of producing a semiconductor device according to claim 1 or 2, wherein the cavity of the substrate is formed with a through hole established on the substrate and a heat sink mounted on one face of the substrate so as to cover an opening of the through hole.

4. A method of producing a semiconductor device according to any of claims 1 or 2, wherein plural globular bumps are established on a substrate face of the substrate.

5. A method of producing a semiconductor device according to any of claims 1 or 2, wherein plural pins are established on a substrate face of the substrate.

6. A method of producing a semiconductor device according to any of claims 1 or 2, wherein the crystalline epoxy resin, component (a), is at least one epoxy resin selected from the group consisting of epoxy resins represented as the following general formulae (1) to (3):

(1)

(2)

-continued (3)

7. A method of producing a semiconductor device according to any of claims 1 or 2, wherein the fused silica powder, component (c), is globular fused silica powder and its maximum particle diameter is not more than 100 μm.

8. A method of producing a semiconductor device according to any of claims 1 or 2, wherein the pellet (B) comprising the encapsulating resin composition (A) is obtained by forming the encapsulating resin composition into a sheet state and punching thereof.

9. A method of producing a semiconductor device according to claim 8, wherein the pellet (B) comprising the encapsulating resin composition (A) has pellet density of not less than 99%.

10. A method of producing a semiconductor device according to claim 1, wherein the pellet (B) comprising the encapsulating resin composition (A) has pellet density of not less than 99%.

* * * * *